(12) United States Patent
Sartori et al.

(10) Patent No.: US 9,989,574 B2
(45) Date of Patent: Jun. 5, 2018

(54) SYSTEM AND METHOD FOR SHORT-CIRCUIT DETECTION IN LOAD CHAINS

(71) Applicant: Infineon Technologies AG, Neubiberg (DE)

(72) Inventors: Damiano Sartori, Padua (IT); Marco Pamato, Schio (IT); Maurizio Galvano, Padua (IT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 233 days.

(21) Appl. No.: 14/723,182

(22) Filed: May 27, 2015

(65) Prior Publication Data

US 2016/0349304 A1   Dec. 1, 2016

(51) Int. Cl.
*G01R 31/02* (2006.01)
*H05B 33/08* (2006.01)
*G01R 31/26* (2014.01)
*B60Q 11/00* (2006.01)

(52) U.S. Cl.
CPC ....... *G01R 31/025* (2013.01); *H05B 33/0827* (2013.01); *H05B 33/0887* (2013.01); *B60Q 11/005* (2013.01); *G01R 31/2635* (2013.01)

(58) Field of Classification Search
None
See application file for complete search history.

(56) References Cited

U.S. PATENT DOCUMENTS

| | | | |
|---|---|---|---|
| 8,878,445 B2 * | 11/2014 | Takata | H05B 33/0815 315/129 |
| 2010/0264828 A1 | 10/2010 | Cortigiani et al. | |
| 2012/0074947 A1 | 3/2012 | Cortigiani et al. | |
| 2013/0265056 A1 * | 10/2013 | Lin | G01R 31/44 324/414 |
| 2015/0355289 A1 * | 12/2015 | Ikawa | H05B 33/0815 324/414 |

* cited by examiner

*Primary Examiner* — Jermele M Hollington
*Assistant Examiner* — Douglas X Rodriguez
(74) *Attorney, Agent, or Firm* — Slater Matsil, LLP

(57) ABSTRACT

An embodiment method for short-circuit detection includes determining a set of local reference voltages each associated with a respective load chain in a plurality of load chains, and determining a global reference voltage in accordance with the set of local reference voltages. The method also includes determining, for each load chain in the plurality of load chains, a respective per-chain reference voltage in accordance with the global reference voltage, and comparing, for each load chain in the plurality of load chains, the respective per-chain reference voltage relative to a respective measured voltage across each load chain to determine a respective short-circuit condition.

17 Claims, 9 Drawing Sheets

SYSTEM AND METHOD FOR SHORT-CIRCUIT DETECTION IN LOAD CHAINS

TECHNICAL FIELD

The present invention relates generally to a system and method for short-circuit detection, and, in particular embodiments, to a system and method for scalable short-circuit detection in chains of electrical loads.

BACKGROUND

Detecting individual short circuits and locating these short circuits in chains of series-connected electrical loads is useful for a variety of applications. These applications include Light-Emitting Diode (LED) chains for automobile displays, personal computer displays, and LED backlighting systems.

Typical LED power supplies may include an LED driver, one or more LED chains, and in some cases a short-circuit detection circuit. The LED driver provides current to the LEDs in the LED chains, and the LEDs have a forward voltage across them in the direction of current flow. An LED chain has a voltage across it that is the sum of the forward voltages of the LEDs making up the chain. The short-circuit detection circuit detects whether a short circuit has occurred in the LED chains. Some implementations use a per-chain dedicated control pin to change the sensing point of the short-circuit detection circuit relative to the LED chains.

SUMMARY OF THE INVENTION

In accordance with an embodiment of the present invention, a method for short-circuit detection is provided. The method includes determining a set of local reference voltages each associated with a respective load chain in a plurality of load chains, and determining a global reference voltage in accordance with the set of local reference voltages. The method also includes determining, for each load chain in the plurality of load chains, a respective per-chain reference voltage in accordance with the global reference voltage, and comparing, for each load chain in the plurality of load chains, the respective per-chain reference voltage relative to a respective measured voltage across each load chain to determine a respective short-circuit condition.

In accordance with an embodiment of the present invention, a short-circuit detection circuit is provided. The circuit is configured to determine a set of local reference voltages each associated with a respective load chain in a plurality of load chains, and determine a global reference voltage in accordance with the set of local reference voltages. The circuit is also configured to determine, for each load chain in the plurality of load chains, a respective per-chain reference voltage in accordance with the global reference voltage, and compare, for each load chain in the plurality of load chains, the respective per-chain reference voltage relative to a respective measured voltage across each load chain to determine a respective short-circuit condition.

In accordance with an embodiment of the present invention, a short-circuit detector is provided. The detector includes a plurality of voltage divider circuits each coupled to a respective chain of electrical loads, and a reference determining circuit including a plurality of transistors coupled to the plurality of voltage divider circuits. The detector also includes a voltage multiplier coupled to the reference determining circuit, and a comparator.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for detecting individual short circuits and locating these short circuits in chains of series-connected LEDs. Further embodiments may be applied to other electrical systems that require loads connected in series.

In an embodiment, a short-circuit detector detects a short circuit of a single LED in a chain of a multichannel LED driver and identifies which is the faulty chain. The short-circuit detector compares the voltage of the LED chain to an internal voltage that is proportional to the LED chain forward-voltage. The input information for the short-circuit detector is the number of LEDs in each chain. A local reference voltage, which is a per-LED equivalent forward voltage, is then respectively obtained for each LED chain as a ratio of the respective output voltage of each chain divided by the respective number of LEDs in each chain.

A voltage determining unit of the short-circuit detector then obtains a global reference voltage, which is a per-LED equivalent forward voltage that may be, for example, the maximum of the local reference voltages. The global reference voltage is then multiplied by the number of LEDs of each chain to obtain a respective per-chain forward reference voltage. A window comparator compares the measured output voltage of each chain with its respective per-chain forward reference voltage to analyze whether all the LEDs of that chain are working or if there is a short-circuit in one or more of the LEDs of the chain.

Figure 1A:
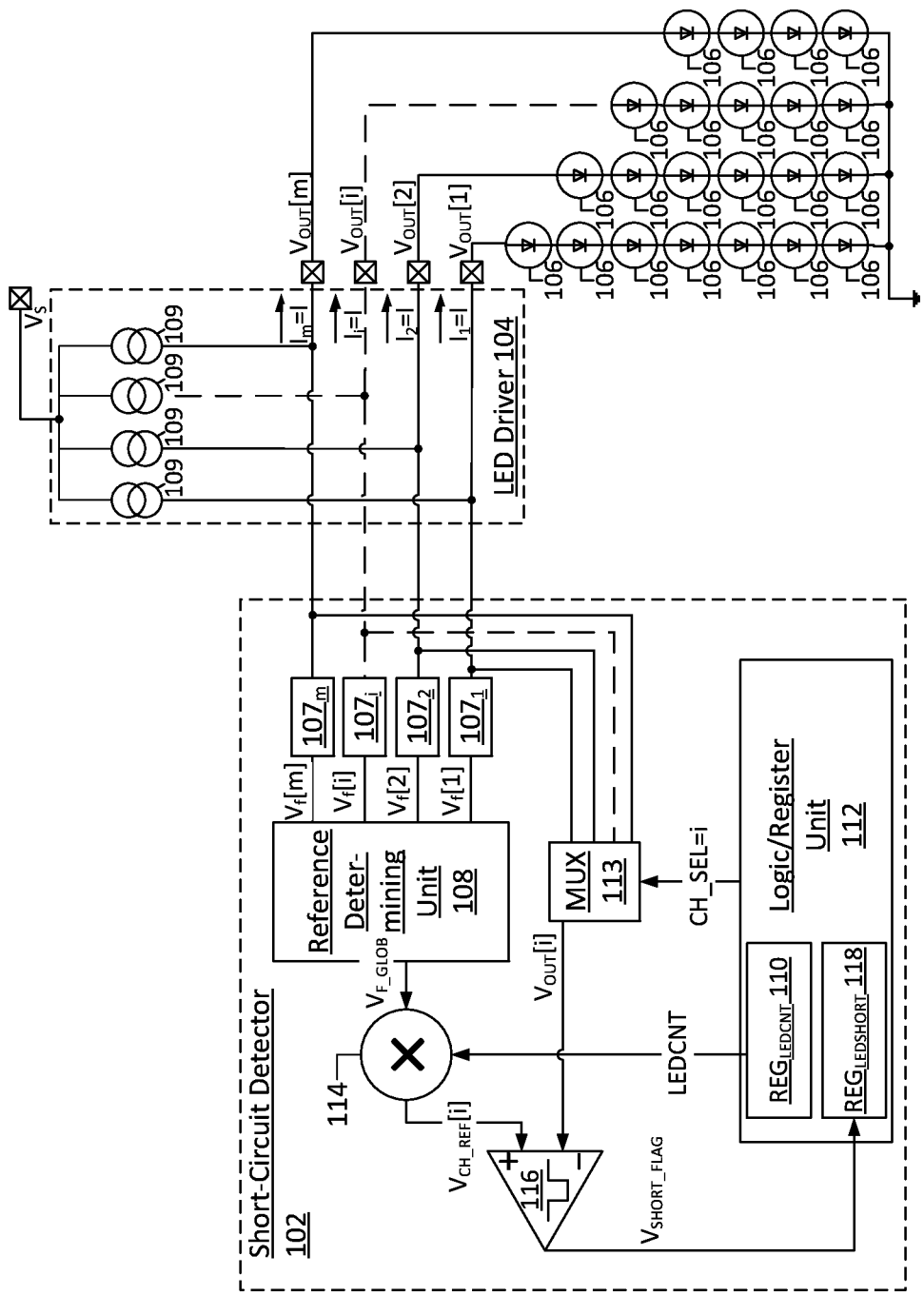
FIG. 1A is a block diagram illustrating a short-circuit detector for a multichannel LED driver in accordance with embodiments of the present invention.

FIG. 1A shows an embodiment short-circuit detector 102 for a multichannel LED driver 104 having m channels that each has a respective chain of LEDs 106. In the embodiment of FIG. 1A, the short-circuit detector 102 has a Logic/Register Unit 112 that receives digital input signals and provides digital output signals, while all other signals within the short-circuit detector 102 are analog signals. In other embodiments, all the signals of the short-circuit detector 102 are digital signals.

The short-circuit detector 102 is configured with the respective number ($N_i$) of LEDs 106 in each chain i. Current sources 109 supply current to the LEDs 106, and are connected between the LEDs 106 and a supply voltage $V_S$. Each current source 109 may be, for example, a switch-mode regulator or other DC/DC regulator, a linear current regulator, etc.

In an embodiment, the components making up the short-circuit detector 102 may all be part of the same Integrated Circuit (IC). In other embodiments, the components making up the short-circuit detector 102 may be divided among a number of separate ICs. In an embodiment, the short-circuit detector 102 is included in the same IC as the LED driver 104. In other embodiments, the short-circuit detector 102 and the LED driver 104 are implemented in different ICs.

The short-circuit detector 102 includes Division Units $107_1$-$107_m$, each of which obtains for a respective LED chain i, a local reference voltage ($V_f[i]$), which is a per-LED equivalent forward voltage for the LEDs 106 in that chain. In an embodiment, Division Units $107_1$-$107_m$ may be implemented using one or more analog buffers and adjustable voltage dividers. In some embodiments, Division Units $107_1$-$107_m$ may be structurally identical. In other embodiments, one or more of Division Units $107_1$-$107_m$ may be structurally distinct.

Local reference voltage $V_f[i]$ is calculated by a given Division Unit $107_i$ as a ratio of the output voltage of chain i ($V_{OUT}[i]$) divided by its number of LEDs 106, according to the following equation:

$$V_f[i] = V_{OUT}[i]/N_i, \, i=1 \ldots m \qquad (1)$$

Reference Determining Unit 108 of the short-circuit detector 102 then obtains a global reference voltage, ($V_{F\_GLOB}$) which is a per-LED equivalent forward voltage for the LEDs 106 of multiple chains and is based on the local reference voltages of these multiple chains. To further describe the calculation of $V_{F\_GLOB}$ by the Reference Determining Unit 108, let F be defined as the set of m local reference voltages, as in Equation 2:

$$F \overset{\Delta}{=} \{V_f[i]\}, \, i=1 \ldots m \qquad (2)$$

In an embodiment, $V_{F\_GLOB}$ may be calculated by taking the maximum local reference voltage $V_f[.]$ in the set F, or:

$$V_{F\_GLOB} = \max\{F\}. \qquad (3)$$

Alternatively, $V_{F\_GLOB}$ can also be calculated according to, for example, any of the following equations:

$$V_{F\_GLOB} = \text{average}\{F\}. \qquad (4)$$

$$V_{F\_GLOB} = \text{average}\{F\backslash\{\max\{F\}\cup\min\{F\}\}\} \qquad (5)$$

In an embodiment, the Reference Determining Unit 108 calculates $V_{F\_GLOB}$ according to Equation 3 using a maximum selector diode. In other embodiments, a circuit having multiple transistors makes up the Reference Determining Unit 108.

The calculated global reference voltage $V_{F\_GLOB}$ is then used in an iterative multiplication and comparison operation. The number of LEDs of each chain are previously stored in an m-element LED Count Register bank ($REG_{LEDCNT}$) 110 of a Logic/Register Unit 112.

The Logic/Register Unit 112 iterates according to an internal clock, selects a chain i for each iteration (where i is incremented from 1 up to m), and indicates the selected chain on a Channel Select (CH_SEL) signal sent to Multiplexer (MUX) 113. The Logic/Register Unit 112 also provides during each iteration the number of LEDs of the selected chain ($REG_{LEDCNT}[i]$) on an LED Count (LEDCNT) signal provided to the Multiplication Unit 114. Multiplication Unit 114 multiplies $V_{F\_GLOB}$ by the number of LEDs of the iteratively selected chains to obtain respective per-chain forward reference voltages ($V_{CH\_REF}[i]$), according to the following equation:

$$V_{CH\_REF}[i] = V_{F\_GLOB} \times REG_{LEDCNT}[i], \, i=1 \ldots m. \qquad (6)$$

A short-circuit flag voltage ($V_{SHORT\_FLAG}$) is calculated during each iteration by a comparator circuit 116. In the embodiment of FIG. 1A, the comparator circuit 116 is a window comparator. To calculate $V_{SHORT\_FLAG}$, the comparator circuit 116 compares the measured output voltage of the selected chain i with its respective $V_{CH\_REF}[i]$ to estimate if all the LEDs 106 of that chain are working or if there are one or more short-circuits in any of its LEDs 106. The short-circuit flag voltage, which is high (or Boolean TRUE) when a short-circuit is detected and is otherwise low (or Boolean FALSE), is calculated with respect to a threshold voltage ($V_{TH}$) according to the following equation:

$$V_{SHORT\_FLAG} = \begin{cases} 1, & V_{CH\_REF}[i] - V_{OUT}[i] > V_{TH} \\ 0, & \text{otherwise} \end{cases}, i=1 \ldots m. \qquad (7)$$

The threshold voltage $V_{TH}$ is chosen to be a fraction of the nominal forward voltage of the LEDs 106. As an example, $V_{TH}$ may be chosen to be equal to 1.6V when 3.2V LEDs are used. In some embodiments, $V_{TH}$ is a fixed value that cannot be adjusted. In other embodiments, $V_{TH}$ is adjustable using, for example, an external pin or an internal Digital-to-Analog Converter (DAC) controlled via a register of the Logic/Register Unit 112.

The short-circuit flag voltage $V_{SHORT\_FLAG}$ is provided to the Logic/Register Unit 112 so that its value can be stored in an m-bit LED Short-Circuit Register ($REG_{LEDSHORT}$) 118 located in the Logic/Register Unit 112. When all the m per-chain forward reference voltages have been compared to the measured output voltages of the chains, then $REG_{LEDSHORT}$ 118 contains the short-circuit status of all the LED chains.

In the embodiment of FIG. 1A, the local and global reference voltages are based on an approximation that all the LEDs 106 serviced by the LED driver 104 have the same operative forward voltage at the same current and temperature, and are each supplied an approximately equal current I by current source 109. Such approximations are often appropriate where, for example, LEDs from the same lot or with similar voltage characteristics are driven with regulated current to present a uniformly bright display. Nevertheless, variation in the forward voltages of the LEDs 106 may limit the maximum number of LEDs 106 ($M_{MAX}$) that can be connected in series in a single chain while still providing accurate single-LED short-circuit detection for that chain. $M_{MAX}$ depends both on the LED forward voltage ($V_{LED}$) in terms of its nominal value and its plus-or-minus deviation ($\Delta$), as indicated in Table 1.

TABLE 1

MAXIMUM NUMBER OF LEDS PER CHAIN

| | $M_{MAX}$ | |
|---|---|---|
| $\Delta$ | $V_{LED} = 2.1\ V \pm \Delta$ | $V_{LED} = 3.2\ V \pm \Delta$ |
| 0.30 V | 2 | 6 |
| 0.20 V | 6 | 13 |
| 0.15 V | 10 | 24 |
| 0.10 V | 23 | 55 |

Figure 1B:
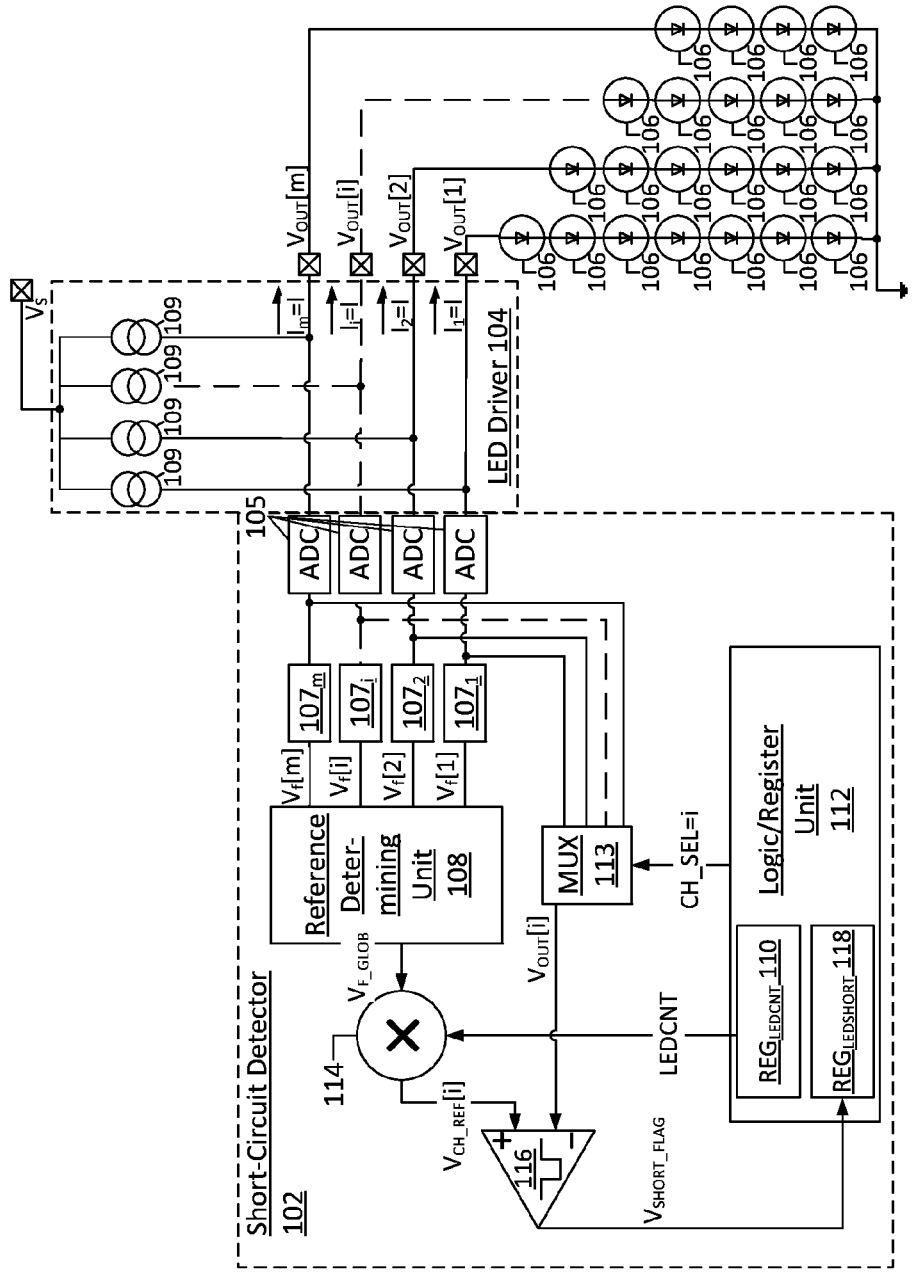
FIG. 1B is a block diagram illustrating a digital embodiment of a short-circuit detector for a multichannel LED driver in accordance with embodiments of the present invention.

FIG. 1B shows an embodiment m-channel short-circuit detector 102 that includes Analog-to-Digital Converters (ADCs) 105 that convert the analog output voltages of each LED chain to digital signals for use by the remaining components of the short-circuit detector 102. In the embodiment of FIG. 1B, the Division Units $107_1$-$107_m$, the Reference Determining Unit 108, the Multiplication Unit 114, the comparator circuit 116, the MUX 113, and the Logic/Register Unit 112 may each be implemented using a computer program or digital circuits, including, for example, logic gate networks and arrays, or programmable register circuits.

Figure 2:
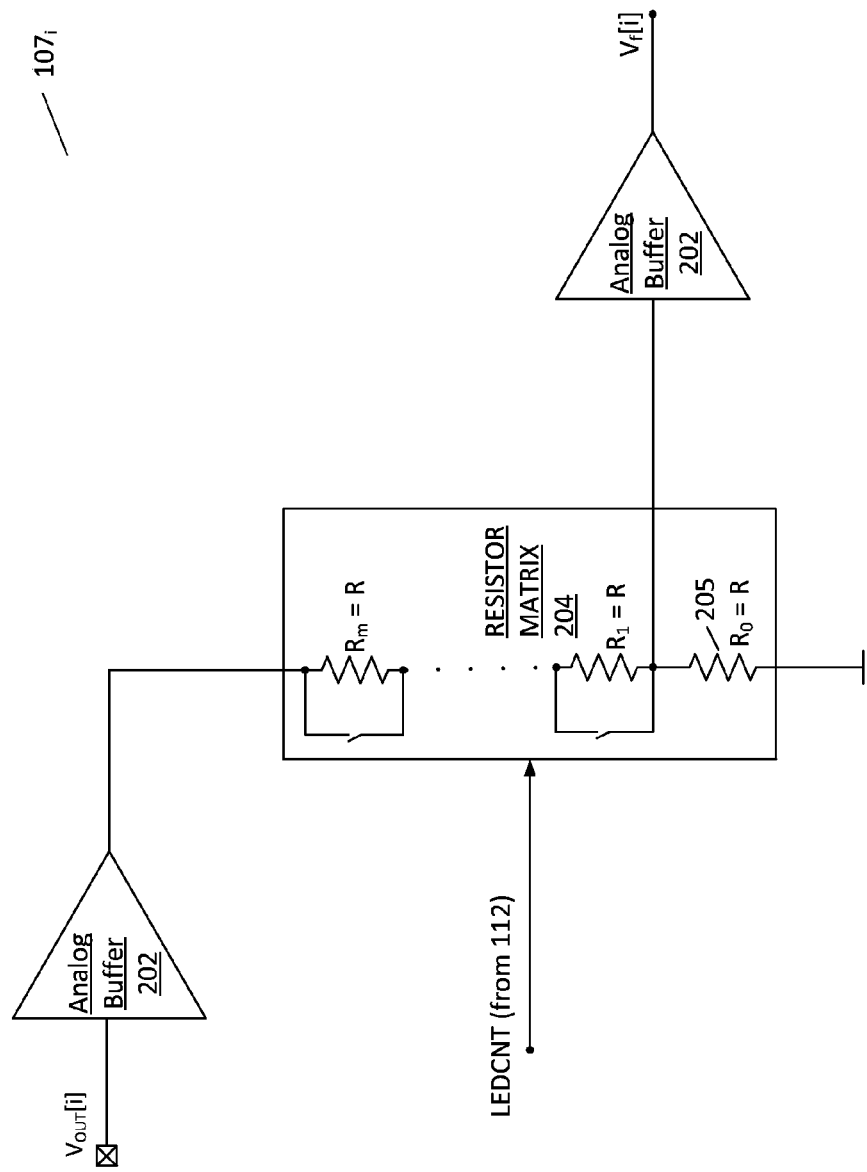
FIG. 2 is a block diagram illustrating a signal divider circuit in accordance with embodiments of the present invention.

FIG. 2 is a block diagram of an embodiment of a Division Unit $107_i$ that is one of structurally identical Division Units $107_1$-$107_m$ of FIG. 1A. The Division Unit $107_i$ includes analog buffers 202 and an adjustable resistor matrix 204. In an initial configuration stage, the digital LEDCNT signal for chain i is provided from Logic/Register Unit 112 to the resistor matrix 204. The resistor matrix 204 also receives $V_{OUT}[i]$ that is buffered by an analog buffer 202. The resistor matrix 204 has m+1 series resistors having the same resistance, and provides an output tapped after a first resistor 205 connected between the upper m resistors and ground to provide an adjustable voltage divider. The resistor matrix 204 closes (m−LEDCNT+1) number of switches each bypassing a resistor (where LEDCNT is in the range [1,m]), so that the $V_{OUT}[i]$ signal is divided by the LEDCNT number of un-bypassed resistors between the buffered $V_{OUT}$[i] signal and the first resistor 205. This divided signal $V_{OUT}[i]$/LEDCNT is buffered by an analog buffer 202 to provide $V_f[i]$ as the output of the Division Unit $107_i$.

Figure 3:
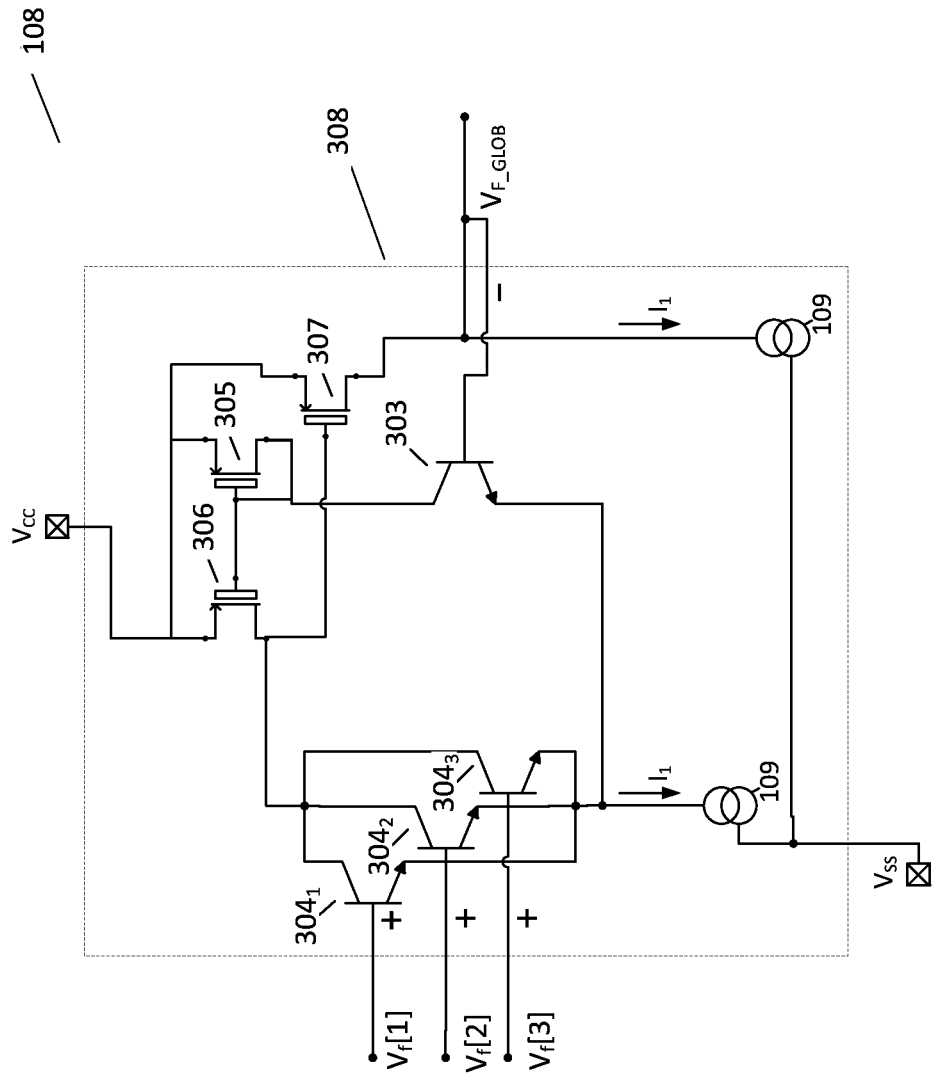
FIG. 3 is a block diagram illustrating a maximum selection circuit for use as a reference determining unit for a three-channel LED driver in accordance with embodiments of the present invention.

FIG. 3 shows a maximum selection circuit 308, which is an analog implementation of the Reference Determining Unit 108 of FIG. 1A for use in a system with only three LED chains. It should be understood that maximum selection circuit 308 illustrated in FIG. 3 is just one specific example of many possible embodiments for Reference Determining Unit 108. In the embodiment of FIG. 3A, the maximum selection circuit 308 has a positive voltage supply $V_{cc}$, a negative voltage supply $V_{ss}$, three non-inverting inputs (+) and a single inverting input (−). Each local reference voltage $V_f[.]$ of the respective LED chains is provided to a non-inverting input. $V_{F\_GLOB}$ is provided as an output of the maximum selection circuit 308 and is also fed back to the inverting input.

The three-channel embodiment of FIG. 3 includes three NPN Bipolar Junction Transistors (BJTs) $304_1$, $304_2$, and $304_3$ each having a base connected to a non-inverting input, an NPN BJT 305 having a base connected to the inverting input, two current sources 109 both coupled to $V_{SS}$ and providing the same current $I_1$, and three p-channel Metal Oxide Semiconductor Field Effect Transistors (MOSFETs) 305, 306, and 307 having sources connected to $V_{CC}$. The emitters of the BJTs $304_1$, $304_2$, and $304_3$ are connected together and to a current source 109, and the collectors of the BJTs $304_1$, $304_2$, and $304_3$ are also connected together. The emitter of BJT 303 is connected to the emitters of BJTs $304_1$, $304_2$, and $304_3$ and to a current source 109. The collector of BJT 303 is connected to both the gate and the drain of MOSFET 305, and is also connected to the gate of MOSFET 306. The drain of MOSFET 306 is connected to the collectors of BJTs $304_1$, $304_2$, and $304_3$ and to the gate of MOSFET 307. The drain of MOSFET 307 is connected to a current source 109 and to the output of the maximum selection circuit 308.

The circuit of FIG. 3 is essentially an operational amplifier having a differential input made of transistor 303 and transistor 304 that includes transistors $304_1$, $304_2$ and $304_3$. By splitting up transistor 304 into three devices $304_1$, $304_2$ and $304_3$ such that the base of each of the three devices are coupled to voltages $V_f[1]$, $V_f[2]$ and $V_f[3]$, the transistor having the highest input voltage conducts most or all of bias current $I_1$. The remaining transistors 304 are effectively shut off due to being starved of current. For example, if $V_f[1]$ is higher than $V_f[2]$ and $V_f[3]$, the emitter of transistor $304_1$ has higher voltage than the emitters of transistors $304_2$ and $304_3$, thereby causing the base-emitter voltages of transistors $304_2$ and $304_3$ to be too low to conduct appreciable current. Accordingly transistor $304_1$ is turned-on while transistors $304_2$ and $304_3$ are turned off. Since transistor $304_1$ is turned-on in this scenario, the feedback action of circuit 308 will cause the base voltage of transistor 303 to approach the base voltage of transistor $304_1$, therefore causing output voltage $V_{F\_GLOB}$ to track $V_f[1]$, or whichever input voltage happens to be the highest. In the above example embodiment, transistor 304 is divided into three sections in order to support three simultaneous measurements. In alternative embodiments, transistor 304 may be partitioned into greater or fewer than three portions in order to support a different number of measurements.

Figure 4:
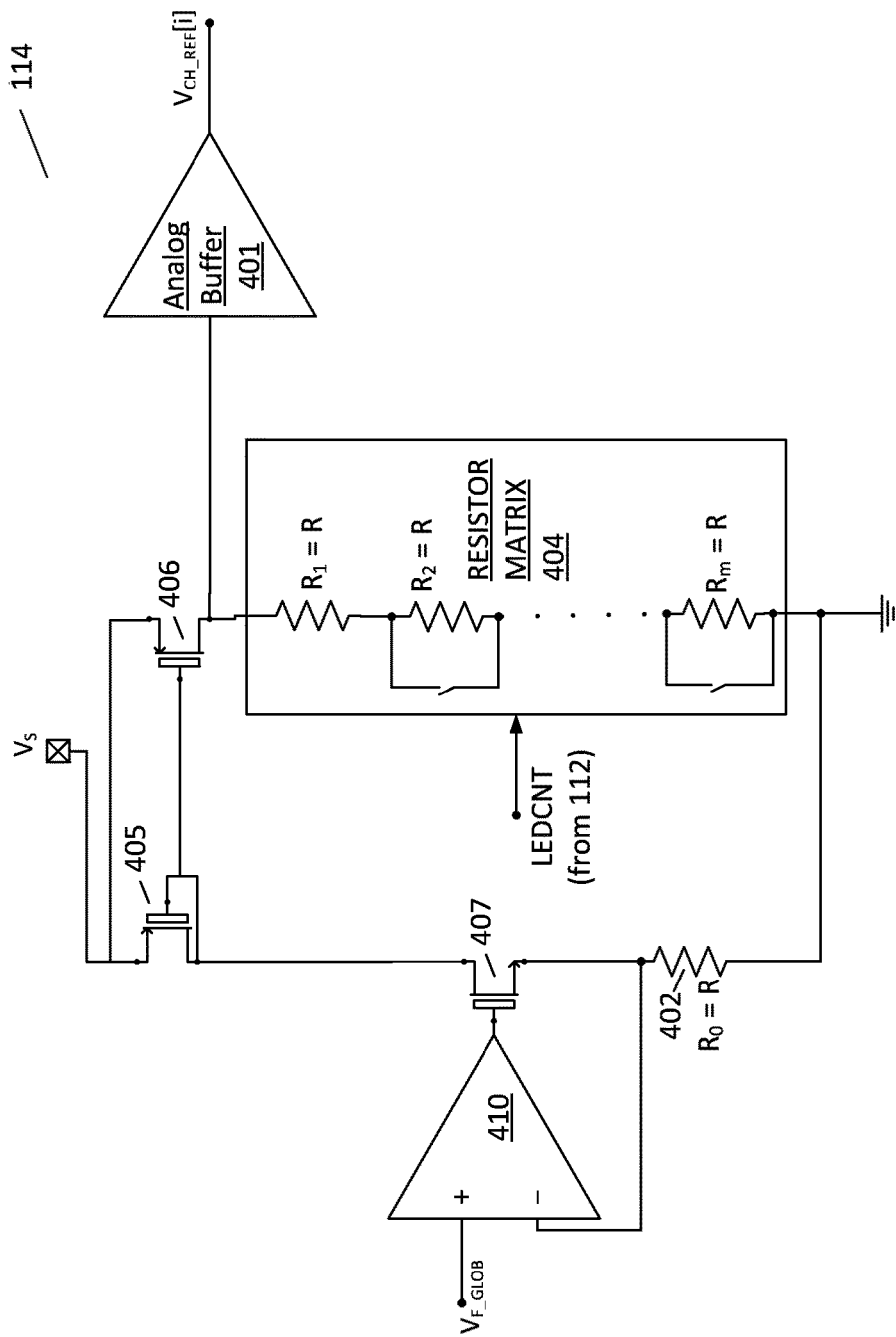
FIG. 4 is a block diagram illustrating a multiplication circuit in accordance with embodiments of the present invention.

FIG. 4 shows an embodiment circuit for use as the Multiplication Unit 114 of FIG. 1A. It should be understood that the circuit illustrated in FIG. 4 is just one specific example of many possible embodiments for the Multiplication Unit 114 that effectively multiplies voltage $V_{F\_GLOB}$ by LEDCNT, which represents the number of active loads or LEDs. In an embodiment, this multiplication is performed by converting voltage $V_{F\_GLOB}$ into a current and applying the current to a selectable number of resistors to provide a scaled or multiplied output voltage. As shown, voltage $V_{F\_GLOB}$ is converted into a current $I_a = V_{F\_GLOB}/R$ using a voltage to current converter made of amplifier 410, NMOS transistor 407 and resistor 402. Current $I_a$ is mirrored to resistor matrix 404 via PMOS transistors 405 and 406. In an embodiment, the mirror ratio of PMOS transistors 405 and 406 is 1-to-1, and the output voltage of resistor matrix 404 is LEDCNT·$V_{F\_GLOB}$.

The Multiplication Unit 114 includes an analog buffer 401, an adjustable resistor matrix 404 with m resistors having the same resistance, a resistor 402 having the same resistance as the m resistors, a differential amplifier 410, two p-channel MOSFETs 405 and 406, and an n-channel MOS- FET 407. The differential amplifier 410 receives global reference voltage $V_{F\_GLOB}$ at its non-inverting input. The resistor 402 is coupled between the inverting input of the differential amplifier 410 and ground. MOSFET 407 has its gate connected to the output of the differential amplifier 410, its source connected to the non-inverting input and the resistor 402, and its drain connected to the drain and the gate of MOSFET 405 and to the gate of MOSFET 406. The source of MOSFET 405 is connected to $V_S$ and to the source of MOSFET 406. The resistor matrix 404 is coupled between the drain of MOSFET 406 and ground. When chain i is selected by the CH_SEL signal of FIG. 1A, the LEDCNT signal representing the number of LEDs in chain i is provided from Logic/Register Unit 112 to the resistor matrix 404. The resistor matrix 404 closes (m−LEDCNT) number of switches each bypassing a resistor (where LEDCNT is in the range [1,m]) so that the drain voltage is multiplied by the LEDCNT number of un-bypassed resistors. This multiplied voltage from the drain of MOSFET 406 is buffered by an analog buffer 202 to provide $V_{CH\_REF}[i]$ as the output of the Multiplication Unit 114.

Figure 5:
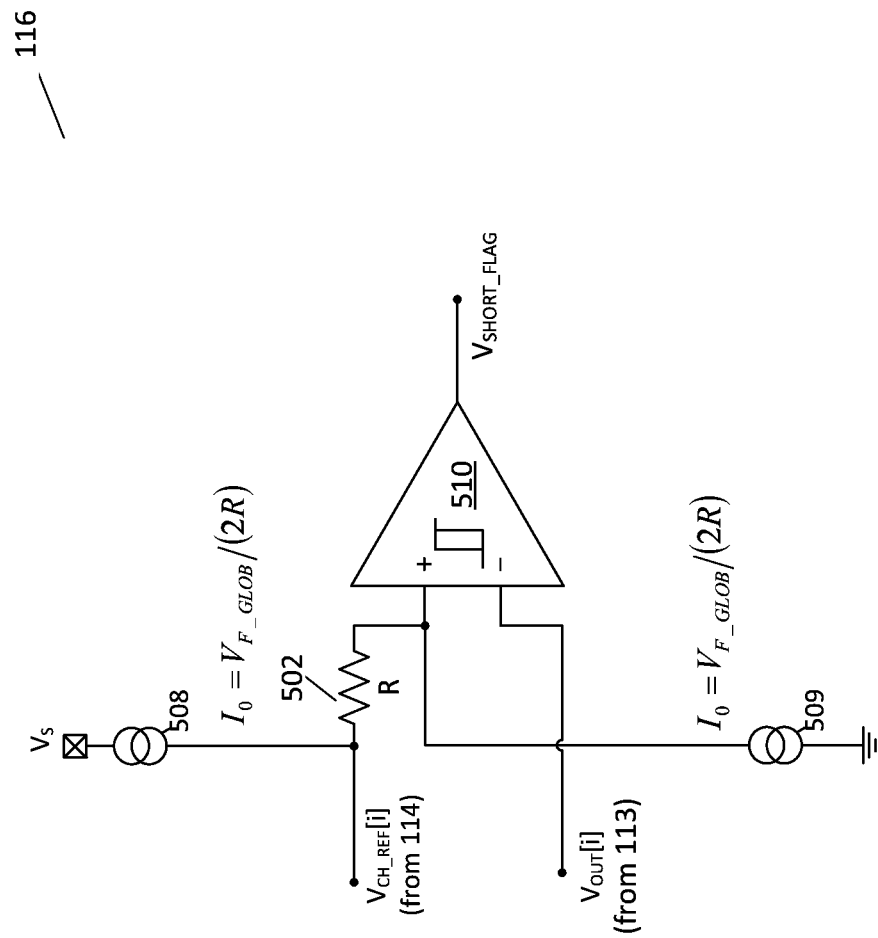
FIG. 5 is a block diagram illustrating a window comparator circuit in accordance with embodiments of the present invention.

FIG. 5 shows an embodiment circuit for use as the comparator circuit 116 of FIG. 1A. It should be understood that the circuit illustrated in FIG. 5 is just one specific example of many possible embodiments for comparator circuit 116. The embodiment circuit of FIG. 5 includes a resistor 502 having a resistance R, current sources 508 and 509 each providing a current $I_0=V_{F\_GLOB}/(2R)$, and a comparator 510. Current source 508 is connected between $V_S$ and the $V_{CH\_REF}[i]$ output of the Multiplication Unit 114, where i is the chain selected by the CH_SEL signal of FIG. 1A. The resistor 502 is connected between the non-inverting input of the comparator 510 and the $V_{CH\_REF\,[i]}$ output of the Multiplication Unit 114. Current source 509 is connected between the non-inverting input of the comparator 510 and ground. The inverting input of the comparator 510 is connected to the $V_{OUT}[i]$ output of the MUX 113. The comparator 510 provides $V_{SHORT\_FLAG}$ as its output.

During operation, a level shifted version of reference voltage $V_{CH\_REF}[i]$ is compared to voltage $V_{OUT}[i]$ via comparator 510. Voltage $V_{CH\_REF\,[i]}$ is level shifted the IR voltage drop of current $I_0$ flowing through resistor R, which is about $V_{F\_GLOB}/2$ when $I_0=V_{F\_GLOB}/(2R)$. This level shift implements a windowing function of the comparator by shifting the reference voltage $V_{CH\_REF}[i]$ by $V_{F\_GLOB}/2$. This window is needed to take into account the natural deviations of the forward voltage of the LED. In alternative embodiments, $I_0$ may be adjusted to implement other level shifting voltages besides $V_{F\_GLOB}/2$ depending on the particular application and its specifications.

Figure 6:
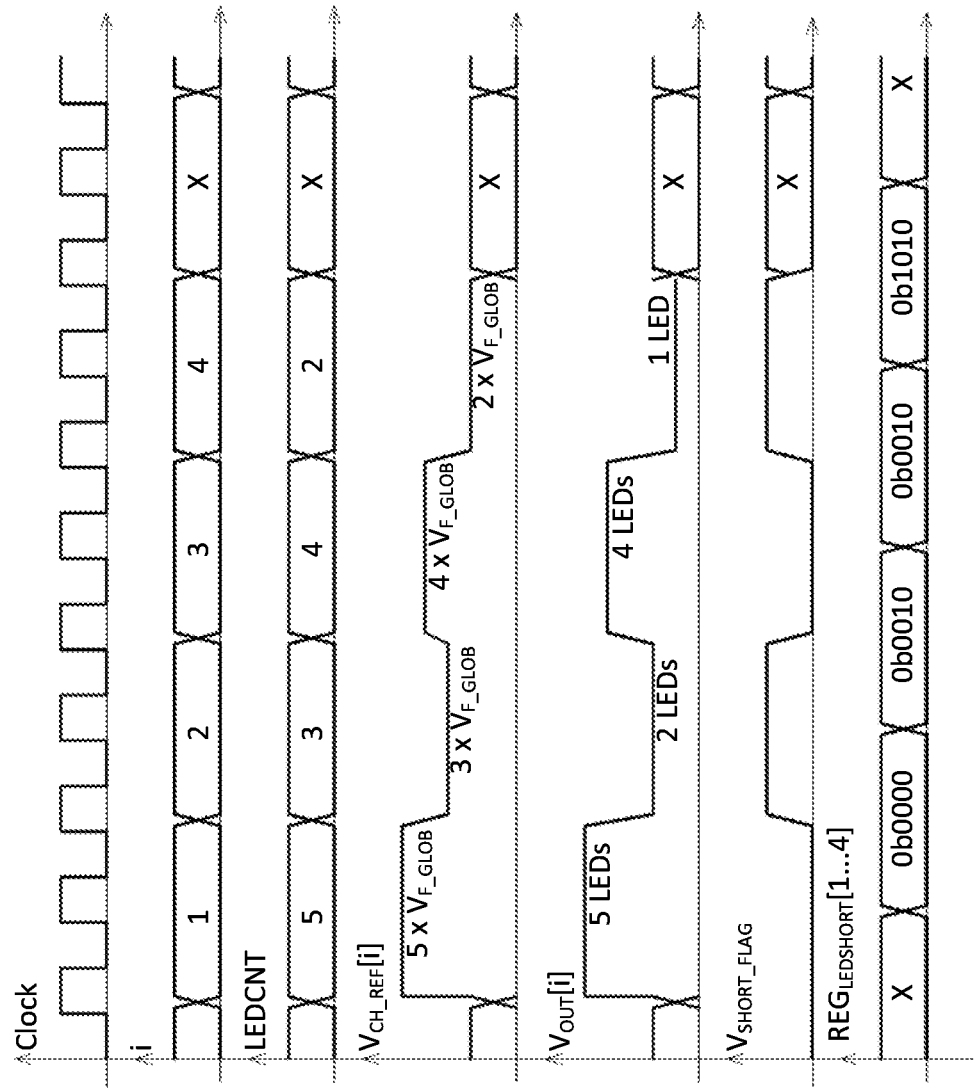
FIG. 6 is a timing diagram of short-circuit detection for a four-channel LED driver in accordance with embodiments of the present invention.
Figure 7:
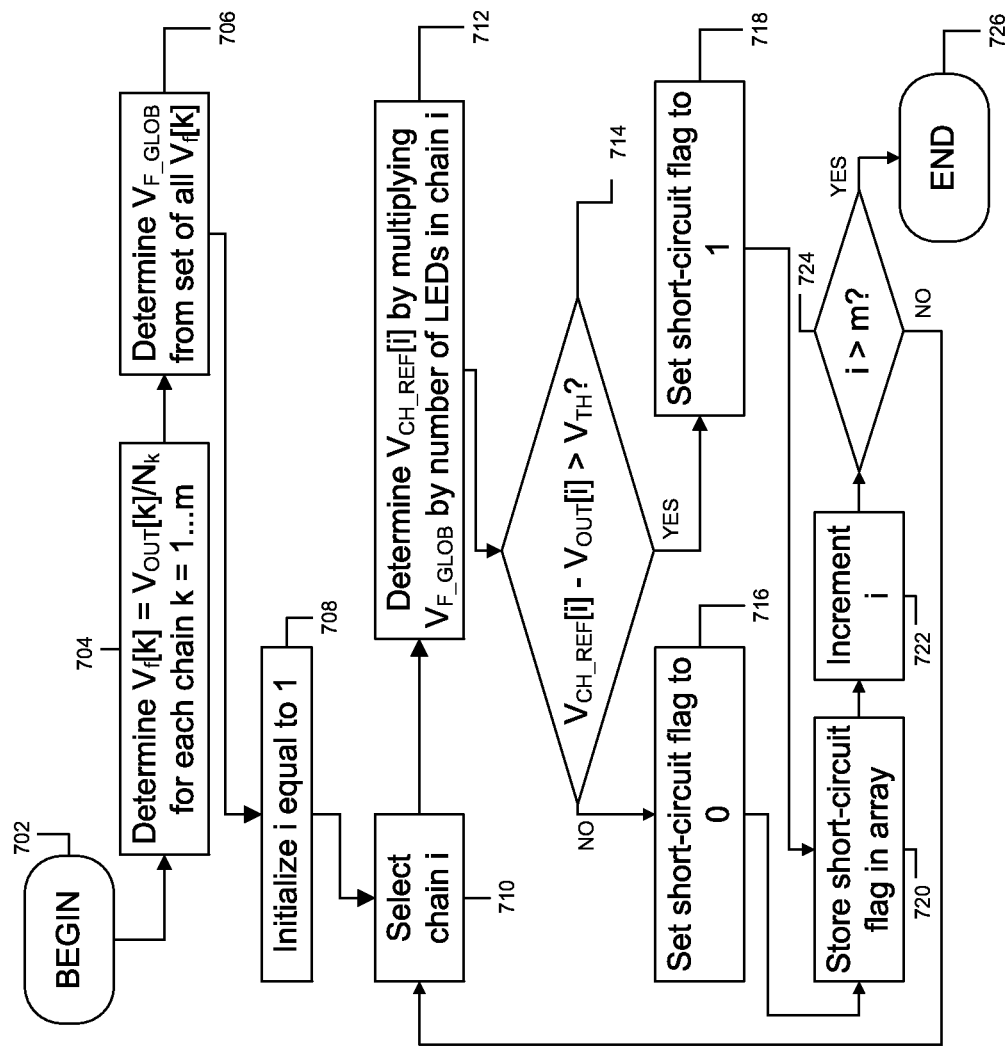
FIG. 7 is a flow diagram of a method of short-circuit detection in accordance with embodiments of the present invention.

Referring now to FIG. 6, an exemplary timing diagram for an embodiment system with 4 LED chains is shown. For this example, the number of LEDs in each chain has been stored in the LED Count Register 110 such that $REG_{LEDCNT}[1]=N_1=5$, $REG_{LEDCNT}[2]=N_2=3$, $REG_{LEDCNT}[3]=N_3=4$, and $REG_{LEDCNT}[4]=N_4=2$. The chain i that is selected is incremented from 1 up to 4, with a new chain selected every 2 clock cycles by the Logic/Register Unit 112. When a new chain is selected, the LEDCNT signal is set equal to $REG_{LEDCNT}[i]$. Chain 1 has no short-circuited LEDs, which is indicated by the value of $V_{OUT}[1]$ equaling the summed forward voltages of 5 LEDs and $V_{CH\_REF}[1]$ similarly equaling 5 times $V_{F\_GLOB}$. Therefore, when i is equal to 1, $V_{SHORT\_FLAG}$ is equal to 0, and a 0 is stored in the least significant bit of $REG_{LEDSHORT}$. The value of $V_{OUT}[2]$ equals the summed forward voltages of 2 LEDs, which is less than the 3 LEDs that would be predicted by the $V_{CH\_REF}[2]$ being 3 times $V_{F\_GLOB}$. Therefore, in this example, chain 2 has a single short-circuited LED, and so when i is equal to 2, $V_{SHORT\_FLAG}$ is equal to 1, and a 1 is stored in the second least significant bit of $REG_{LEDSHORT}$. Chain 3 has no short-circuited LEDs and has signaling similar to chain 1. Chain 4 has a single short-circuited LED and has signaling similar to chain 2:

Referring now to FIG. 7, an embodiment method for detecting a short circuit is shown, beginning at step 702. At step 704, the respective local reference voltages $V_f[k]$ for each chain k in a set of m LED chains are calculated as a ratio of the respective output voltage $V_{OUT}[k]$ and the respective number $N_k$ of LEDs in each chain. At step 706, $V_{F\_GLOB}$ is determined from the set of all $V_f[k]$ according to Equations 3-5. At step 708, a channel selection index i is initialized to 1, indicating the first LED chain. At step 710, a loop begins as the chain corresponding to the channel selection index i is selected. At step 712, the per-chain forward reference voltage $V_{CH\_REF}[i]$ is calculated for the selected chain i by multiplying the number of LEDs in chain i with $V_{F\_GLOB}$. At step 714, a comparison is made to determine whether the difference of $V_{CH\_REF}[i]$ subtracted from $V_{OUT}[i]$ is greater than the threshold voltage $V_{TH}$. If this difference is lower than the threshold voltage, flow continues at step 716 where the short-circuit flag is set to 0, and otherwise flow continues at step 718 where the short circuit flag is set to 1. In either case, flow then continues at step 720, where the short-circuit flag is stored in an array, for example, at index i or index (m−i) of the array. At step 722, the channel selection index i is incremented. At step 724, a comparison is made between the channel selection index i and the number of chains m. If i is less than or equal to m, the chain selection loop repeats at step 710. If i is greater than m, the short-circuit detection method ends at step 726.

Figure 8:
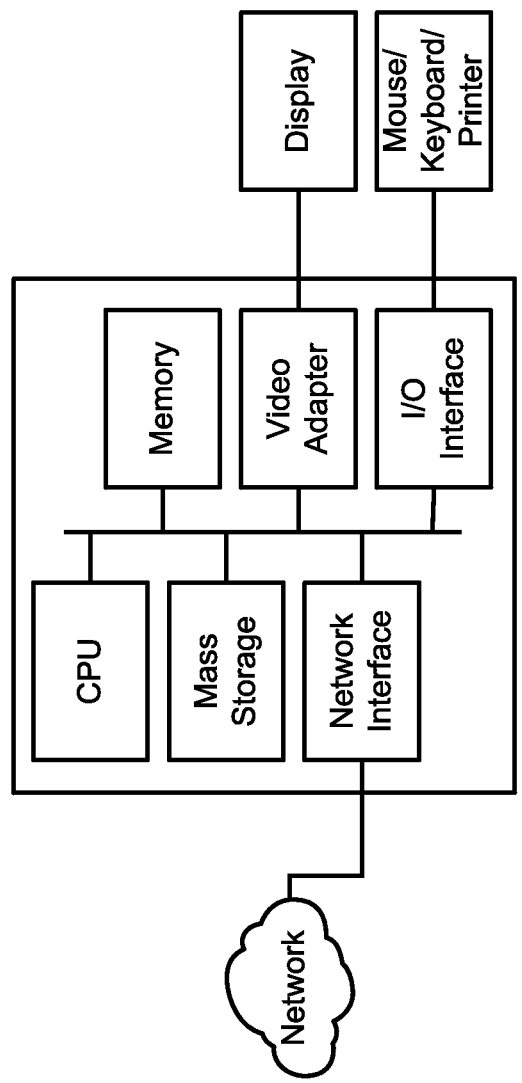
FIG. 8 is a block diagram of a processing system that may be used for implementing some of the devices and methods disclosed herein in accordance with embodiments of the present invention.

FIG. 8 shows a block diagram of a processing system that may be used for implementing some of the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. In an embodiment, the processing system comprises a computer workstation. The processing system may comprise a processing unit equipped with one or more input/output devices, such as a speaker, microphone, mouse, touchscreen, keypad, keyboard, printer, display, and the like. The processing unit may include a CPU, memory, a mass storage device, a video adapter, and an I/O interface connected to a bus. In an embodiment, multiple processing units in a single processing system or in multiple processing systems may form a distributed processing pool or distributed editing pool.

The bus may be one or more of any type of several bus architectures including a memory bus or memory controller, a peripheral bus, video bus, or the like. The CPU may comprise any type of electronic data processor. The memory may comprise any type of system memory such as random access memory (RAM), static RAM (SRAM), dynamic RAM (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device may comprise any type of storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

The video adapter and the I/O interface provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces, which may comprise wired links, such as an Ethernet cable or the like, and/or wireless links to access nodes or different networks. The network interface allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like. The network interface may be configured to have various connection-specific virtual or physical ports communicatively coupled to one or more of these remote devices.

Advantages of embodiments of the present invention include the ability to detect short circuit conditions in multiple loads without per-chain dedicated control pins. Further advantages may include reduced hardware costs and complexity, increased scalability, and effective short-circuit detection of individual electrical loads so that radiant power at each load may be maintained within a narrow range.

In an embodiment, a method for short-circuit detection includes determining a set of local reference voltages each associated with a respective load chain in a plurality of load chains. In the foregoing embodiment, the determining the set of local reference voltages includes determining, for each load chain in the plurality of load chains, a respective local reference voltage including a ratio of a respective measured voltage across each load chain divided by a respective number of electrical loads in each load chain.

In an embodiment of the method for short-circuit detection, the electrical loads include light-emitting diodes.

In an embodiment, the method for short-circuit detection further includes determining, for each load chain in a plurality of load chains, a respective per-chain reference voltage in accordance with a global reference voltage. In the foregoing embodiment, the determining the respective per-chain reference voltage for each load chain includes multiplying the global reference voltage with a respective number of electrical loads in each load chain.

In an embodiment, the method for short-circuit detection further includes determining a global reference voltage in accordance with a set of local reference voltages. In the foregoing embodiment, the determining the global reference voltage includes determining a maximum voltage of the set of local reference voltages.

In an embodiment of the method for short-circuit detection, determining a global reference voltage includes calculating an average voltage of a set of local reference voltages.

In an embodiment of the method for short-circuit detection, determining a global reference voltage includes excluding a maximum voltage and a minimum voltage of a set of local reference voltages to determine a subset of local reference voltages, and calculating an average voltage of the subset.

In an embodiment, the method for short-circuit detection further includes comparing, for each load chain in a plurality of load chains, a respective per-chain reference voltage relative to a respective measured voltage across each load chain to determine a respective short-circuit condition. In the foregoing embodiment, the comparing the respective per-chain reference voltage includes calculating a voltage difference of the respective measured voltage subtracted from the respective per-chain reference voltage, and determining the respective short-circuit condition such that a short circuit is detected when the voltage difference is greater than a threshold voltage and the short circuit is not detected otherwise.

In an embodiment, the method for short-circuit detection further includes storing a respective short-circuit condition in a storage device.

An embodiment short-circuit detection circuit is configured to determine, for each load chain in a plurality of load chains, a respective local reference voltage in a set of local reference voltages, the respective local reference voltage including a ratio of a respective measured voltage across each load chain divided by a respective number of electrical loads in each load chain.

In an embodiment of the short-circuit detection circuit, the electrical loads include light-emitting diodes.

In an embodiment, the short-circuit detection circuit is further configured to multiply a global reference voltage with a respective number of electrical loads in each load chain to determine a respective per-chain reference voltage for each load chain.

In an embodiment of the short-circuit detection circuit, a global reference voltage includes a maximum voltage of a set of local reference voltages.

In an embodiment of the short-circuit detection circuit, a global reference voltage includes an average voltage of a set of local reference voltages.

In an embodiment, the short-circuit detection circuit is further configured to exclude a maximum voltage and a minimum voltage of a set of local reference voltages to determine a subset of local reference voltages; and calculate an average voltage of the subset to determine a global reference voltage.

In an embodiment, the short-circuit detection circuit is further configured to calculate a voltage difference of a respective measured voltage subtracted from a respective per-chain reference voltage, and determine a respective short-circuit condition such that a short circuit is detected when the voltage difference is greater than a threshold voltage and the short circuit is not detected otherwise.

In an embodiment, the short-circuit detection circuit is further configured to store a respective short-circuit condition in a storage device.

In an embodiment, the short-circuit detection circuit further includes a processor configured to perform the steps of determining a set of local reference voltages, determining a global reference voltage, determining, for each load chain, a respective per-chain reference voltage, and determining, for each load chain, a respective short-circuit condition.

An embodiment short-circuit detector includes a plurality of analog-to-digital converters coupled between a plurality of voltage divider circuits and a plurality of input terminals.

In an embodiment of the short-circuit detector, each voltage divider circuit in a plurality of voltage divider circuits includes a selectable voltage divider circuit including a plurality of selectable resistors.

In an embodiment, the short-circuit detector further includes a plurality of transistors and a reference determining circuit. In the foregoing embodiment, the reference determining circuit further includes a plurality of non-inverting input terminals and an inverting input terminal. In the foregoing embodiment, a first set of transistors in the plurality of transistors is coupled to the plurality of non-inverting input terminals, and a second transistor in the plurality of transistors is coupled to the inverting input terminal.

In an embodiment, the short-circuit detector further includes a voltage multiplier. In the foregoing embodiment, the voltage multiplier includes a resistor matrix including at least one selectable resistor, a differential amplifier, and a voltage-to-current converter coupled between an output of the differential amplifier and the resistor matrix.

In an embodiment, the short-circuit detector further includes a comparator. In the foregoing embodiment, the comparator includes a window comparator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A short-circuit detection circuit comprising:
   a local reference determining circuit configured to determine a set of local reference voltages each associated with a respective load chain in a plurality of load chains;
   a global reference voltage determining circuit configured to determine a global reference voltage in accordance with the set of local reference voltages;
   a per-chain reference voltage determining circuit configured to determine, for each load chain in the plurality of load chains, a respective per-chain reference voltage in accordance with the global reference voltage; and
   a comparator configured to compare, for each load chain in the plurality of load chains, the respective per-chain reference voltage relative to a respective measured voltage across each load chain to determine a respective short-circuit condition.

2. The short-circuit detection circuit of claim 1, further configured to:
   determine, for each load chain in the plurality of load chains, a respective local reference voltage in the set of local reference voltages, the respective local reference voltage comprising a ratio of the respective measured voltage across each load chain divided by a respective number of electrical loads in each load chain.

3. The short-circuit detection circuit of claim 2, wherein the electrical loads comprise light-emitting diodes.

4. The short-circuit detection circuit of claim 1, further configured to:
   multiply the global reference voltage with a respective number of electrical loads in each load chain to determine the respective per-chain reference voltage for each load chain.

5. The short-circuit detection circuit of claim 1, wherein the global reference voltage comprises a maximum voltage of the set of local reference voltages.

6. The short-circuit detection circuit of claim 1, wherein the global reference voltage comprises an average voltage of the set of local reference voltages.

7. The short-circuit detection circuit of claim 1, further configured to:
   exclude a maximum voltage and a minimum voltage of the set of local reference voltages to determine a subset of local reference voltages; and
   calculate an average voltage of the subset to determine the global reference voltage.

8. The short-circuit detection circuit of claim 1, further configured to:
   calculate a voltage difference of the respective measured voltage subtracted from the respective per-chain reference voltage; and
   determine the respective short-circuit condition such that a short circuit is detected when the voltage difference is greater than a threshold voltage and the short circuit is not detected otherwise.

9. The short-circuit detection circuit of claim 1, further configured to store the respective short-circuit condition in a storage device.

10. The short-circuit detection circuit of claim 1, wherein the local reference voltage determining circuit, the global reference voltage determining circuit, the per-chain reference voltage determining circuit and the comparator are implemented using a processor.

11. The short-circuit detection circuit of claim 1, wherein:
    the local reference determining circuit comprises a plurality of voltage divider circuits each coupled to a respective chain of electrical loads;
    the global reference voltage determining circuit comprises a plurality of transistors coupled to the plurality of voltage divider circuits; and
    the per-chain reference voltage determining circuit comprises a voltage multiplier coupled to the reference determining circuit.

12. The short-circuit detection circuit of claim 11, further comprising a plurality of analog-to-digital converters coupled between the plurality of voltage divider circuits and a plurality of input terminals.

13. The short-circuit detection circuit of claim 11, wherein each voltage divider circuit in the plurality of voltage divider circuits comprises a selectable voltage divider circuit comprising a plurality of selectable resistors.

14. The short-circuit detection circuit of claim 11, wherein the global reference voltage determining circuit further comprises a plurality of non-inverting input terminals and an inverting input terminal, wherein:
    a first set of transistors in the plurality of transistors is coupled to the plurality of non-inverting input terminals; and
    a second transistor in the plurality of transistors is coupled to the inverting input terminal.

15. The short-circuit detection circuit of claim 11, wherein the voltage multiplier comprises:
    a resistor matrix comprising at least one selectable resistor; and
    a voltage-to-current converter coupled between an input of the voltage multiplier and the resistor matrix, the voltage-to-current converter comprising a differential amplifier having a first input coupled to the input of the voltage multiplier, a resistor coupled to an output of the differential amplifier and to a second input of the differential amplifier, and a current mirror coupled between the output of the differential amplifier and the resistor matrix.

16. The short-circuit detection circuit of claim 11, wherein the comparator comprises a window comparator.

17. The short-circuit detection circuit of claim 11, wherein the plurality of voltage divider circuits, the global reference voltage determining circuit, the voltage multiplier, and the comparator are all disposed in a single integrated circuit.

* * * * *